(12) United States Patent
Hshieh et al.

(10) Patent No.: US 6,518,152 B2
(45) Date of Patent: Feb. 11, 2003

(54) METHOD OF FORMING A TRENCH SCHOTTKY RECTIFIER

(75) Inventors: Fwu-Iuan Hshieh, Saratoga, CA (US); Max Chen, Taipei (TW); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/043,633

(22) Filed: Jan. 10, 2002

(65) Prior Publication Data

US 2002/0066926 A1 Jun. 6, 2002

Related U.S. Application Data

(62) Division of application No. 09/653,084, filed on Aug. 31, 2000.

(51) Int. Cl.[7] .............................................. H01L 21/28
(52) U.S. Cl. ...................................... 438/570; 438/576
(58) Field of Search ................................. 438/576, 580, 438/582, 577, 578, 380

(56) References Cited

U.S. PATENT DOCUMENTS 5,962,893 A * 10/1999 Omura et al. ............... 257/155

* cited by examiner

Primary Examiner—Tuan H. Nguyen
(74) Attorney, Agent, or Firm—Mayer Foertkort & Williams, PC; David B. Bonham, Esq.; Karin L. Williams, Esq (57) ABSTRACT

A Schottky rectifier is provided. The Schottky rectifier comprises: (a) a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) one or more trenches extending from the second face into the semiconductor region and defining one or more mesas within the semiconductor region; (c) an insulating region adjacent the semiconductor region in lower portions of the trench; (d) and an anode electrode that is (i) adjacent to and forms a Schottky rectifying contact with the semiconductor at the second face, (ii) adjacent to and forms a Schottky rectifying contact with the semiconductor region within upper portions of the trench and (iii) adjacent to the insulating region within the lower portions of the trench.

14 Claims, 10 Drawing Sheets

METHOD OF FORMING A TRENCH SCHOTTKY RECTIFIER

CROSS-REFERENCE TO RELATED APPLICATION

This Application is a division of co-pending U.S. patent application Ser. No. 09/653,084, filed Aug. 31, 2000 entitled "Trench Schottky Rectifier".

FIELD OF THE INVENTION

This invention relates to rectifiers and more particularly to Schottky barrier rectifying devices, and methods of forming these devices.

BACKGROUND OF THE INVENTION

Rectifiers exhibit relatively low resistance to current flow in a forward direction and a high resistance to current flow in a reverse direction. Schottky barrier rectifiers are a type of rectifier that have found use as output rectifiers in switching-mode power supplies and in other high-speed power switching applications, such as motor drives. These devices are capable of carrying large forward currents and supporting large reverse blocking voltages.

Figure 1:
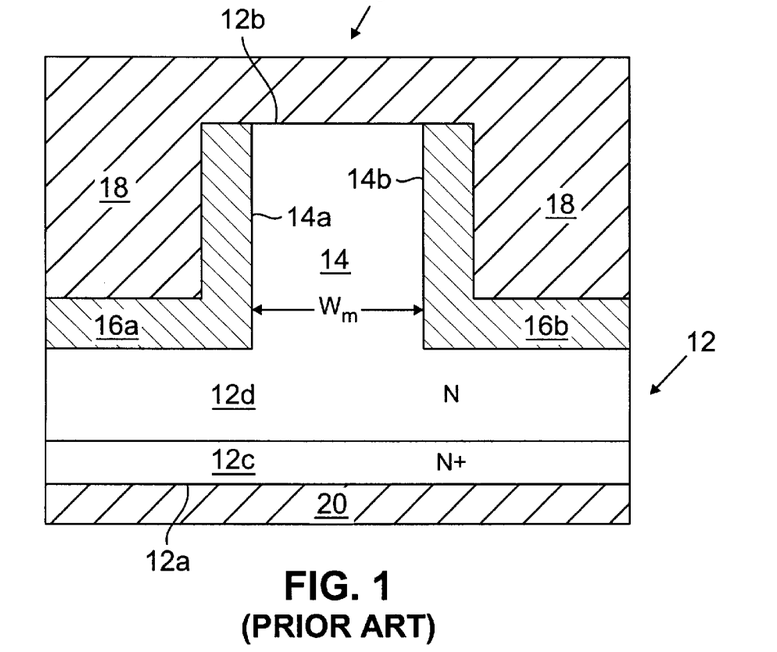
FIG. 1 illustrates a cross-sectional representation of a trench MOS barrier Schottky rectifier according to the prior art.

U.S. Pat. No. 5,365,102 to Mehrotra et al. and entitled "Schottky Barrier Rectifier with MOS Trench", the entire disclosure of which is hereby incorporated by reference, discloses Schottky barrier rectifiers which have a higher breakdown voltage than is theoretically attainable with an ideal abrupt parallel-plane P-N junction. A cross-sectional representation of one embodiment of the described rectifiers is illustrated in FIG. 1. In this figure, rectifier 10 includes a semiconductor substrate 12 of first conductivity type, typically N-type conductivity, having a first face 12a and a second opposing face 12b. The substrate 12 comprises a relatively highly doped cathode region 12c (shown as N+) adjacent the first face 12a. A drift region 12d of first conductivity type (shown as N) extends from the cathode region 12c to the second face 12b. Accordingly, the doping concentration of the cathode region 12c is greater than that of the drift region 12d. A mesa 14 having a cross-sectional width "Wm", defined by opposing sides 14a and 14b, is formed in the drift region 12d. The mesa can be of stripe, rectangular, cylindrical or other similar geometry. Insulating regions 16a and 16b (described as $SiO_2$) are also provided on the mesa sides. The rectifier also includes an anode electrode 18 on the insulating regions 16a, 16b. The anode electrode 18 forms a Schottky rectifying contact with the mesa 14 at second face 12b. The height of the Schottky barrier formed at the anode electrode/mesa interface is dependent on the type of electrode metal and semiconductor (e.g., Si, Ge, GaAs, and SiC) used and is also dependent on the doping concentration in the mesa 14. Finally, a cathode electrode 20 is provided adjacent the cathode region 12c at the first face 12a. The cathode electrode 20 ohmically contacts cathode region 12c.

According to U.S. Pat. No. 5,612,567, desirable effects are achieved with the device of FIG. 1, due to the occurrence of charge coupling between the majority charge carriers in the mesa-shaped portion of the drift region 14 and the portion of the metal anode 18 opposite the insulated sidewalls 16a, 16b of the trenches. Specifically, the electric field at center of the metal-semiconductor contact (Schottky contact) is reduced significantly relative to an ideal plane-parallel rectifier. The reduction in electric field at the center of the Schottky contact causes a significant decrease in the reverse-biased leakage current through a reduction in Schottky barrier height lowering. Reverse-biased leakage current is the current in the rectifier during a reverse-biased (blocking) mode of operation. Moreover, the peak in the electric field profile shifts away from the metal-semiconductor contact and into the drift region. As the peak of the electric field moves away from the Schottky contact, the mesa is able to support more voltage, and thus provides higher breakdown voltages (reverse blocking voltages) than those of an ideal parallel-plane rectifier.

As the voltages of modem power supplies continue to decrease in response to need for reduced power consumption and increased energy efficiency, it becomes advantageous to decrease the forward-biased voltage drop across a power rectifier. The need for reduced power consumption also generally makes it advantageous to minimize reverse-biased leakage current. Hence, to minimize power consumption, both the forward-biased voltage drop and reverse-biased leakage current should be minimized.

Unfortunately, although the trench Schottky rectifier of U.S. Pat. No. 5,365,102 results in high reverse-biased breakdown voltage (blocking voltages) and lower reverse-biased leakage current, this design is nevertheless disadvantageous for many energy-efficient applications, because it results in an undesirably high forward-biased voltage drop across the rectifier.

U.S. Pat. No. 5,612,567 to Bagila and entitled "Schottky Barrier Rectifiers and Methods of Forming the Same," the entire disclosure of which is hereby incorporated by reference, discloses that low forward-biased voltage drop, low reverse-biased leakage current and high breakdown voltage can be simultaneously achieved by modifying the trench Schottky rectifier of U.S. Pat. No. 5,365,102. Specifically, the mesa-shaped portion of the drift region is provided with a non-uniform doping concentration, which is said to provide low forward-biased voltage drop, along with high blocking voltage capability and low reverse-biased leakage current. The drift region is preferably non-uniformly doped so that the doping concentration increases monotonically in a direction away from the Schottky rectifying junction formed between the anode electrode and the drift region. This non-uniform doping is preferably achieved by performing computer-controlled in-situ doping, during epitaxial growth of the drift region upon a more highly doped cathode region. The doping profile and concentrations are preferably selected so that when the rectifier is reverse biased at the onset of breakdown, the electric field profile in the drift region is substantially uniform and/or negatively sloped to have a monotonically decreasing profile in a direction from the Schottky rectifying junction to the cathode region.

Unfortunately, the need for a graded doping profile introduces substantial complexity, and hence expense, into the manufacturing process. Accordingly, there remains a need within the art to provide a Schottky barrier rectifier device that can be easily manufactured, while simultaneously providing low forward-biased voltage drop, low reverse-biased leakage current and high breakdown voltage.

SUMMARY OF THE INVENTION

The above and other needs are met by the present invention. In particular, a Schottky rectifier is provided which comprises: (a) a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) one or more trenches extending from the second face into the semiconductor region and defining one or more mesas within the semiconductor region; (c) an insulating region adjacent the semiconductor region in lower portions of the trench; (d) and an anode electrode that is (i) adjacent to and forms a Schottky rectifying contact with the semiconductor region at the second face, (ii) adjacent to and forms a Schottky rectifying contact with the semiconductor region within upper portions of the trench and (iii) adjacent to the insulating region within the lower portions of the trench.

Preferably, the semiconductor is silicon, the first conductivity type is n-type conductivity, and a cathode electrode is provided on the first face.

The lower portions of the trenches preferably correspond to approximately 25 to 40% of the depth of the trenches. In some embodiments, the trench extends into the cathode region, with the insulated lower portions of the trench preferably extending between the cathode region and the drift region.

The insulating region preferably comprises silicon dioxide, which can be either deposited or thermally grown.

In some embodiments, a polysilicon region is disposed on the insulating region and forms part of the anode electrode.

The present invention also provides a method of forming a trench Schottky rectifier. The method comprises: (a) forming a semiconductor region having first and second opposing faces, with the semiconductor region comprising a cathode region of first conductivity type adjacent the first face and a drift region of the first conductivity type adjacent the second face, and with the drift region having a lower net doping concentration than that of the cathode region; (b) forming one or more trenches extending from the second face into the semiconductor region, with the trenches defining one or more mesas within the semiconductor region; (c) forming an insulating region adjacent the semiconductor region in lower portions of the trench; (d) and forming an anode electrode that is (i) adjacent to and forms a Schottky rectifying contact with the semiconductor region at the second face, (ii) adjacent to and forms a Schottky rectifying contact with the semiconductor region within upper portions of the trench and (iii) adjacent to the insulating region within the lower portions of the trench.

The step of forming the semiconductor region preferably comprises providing a semiconductor substrate that corresponds to the cathode region, and growing an epitaxial semiconductor layer that corresponds to the drift region on the substrate.

The step of forming the trenches preferably comprises the steps of forming a patterned masking layer over the second face of the semiconductor region and etching the trenches through the masking layer.

The step of forming the insulating region can comprise providing an oxide layer over the second face and in the trenches, and subsequently etching portions of the oxide layer. In some embodiments, a photoresist pattern is provided on the oxide layer (which can be thermally grown), and portions of the oxide layer not covered by the photoresist etched, whereupon the photoresist is removed. In other embodiments, a polysilicon layer is provided on the oxide layer (which can be thermally grown), and the polysilicon layer is etched such that portions of the oxide layer over the second face and over the upper portions of the trenches are exposed, and these exposed portions are subsequently removed by etching.

The step of forming the insulating region can also comprise depositing an oxide layer. For example, a tetraethylorthosilicate layer can be deposited on the second face and within the trenches. The tetraethylorthosilicate layer can then be etched until it is removed from the second surface and the upper portions of the trenches. Subsequently, the tetraethylorthosilicate can be converted into a high-density silicon dioxide layer.

One advantage of the present invention is that a novel Schottky barrier rectifier is provided having low forward-biased voltage drop, low reverse-biased leakage current and high breakdown voltage.

Another advantage is that such a Schottky barrier rectifier can be made using simple, and thus economical, manufacturing techniques.

Still other embodiments and advantages will become readily apparent to those skilled in the art upon review of the Detailed Description, Examples and Claims set forth below.

DETAILED DESCRIPTION OF CERTAIN PREFERRED EMBODIMENTS OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 2:
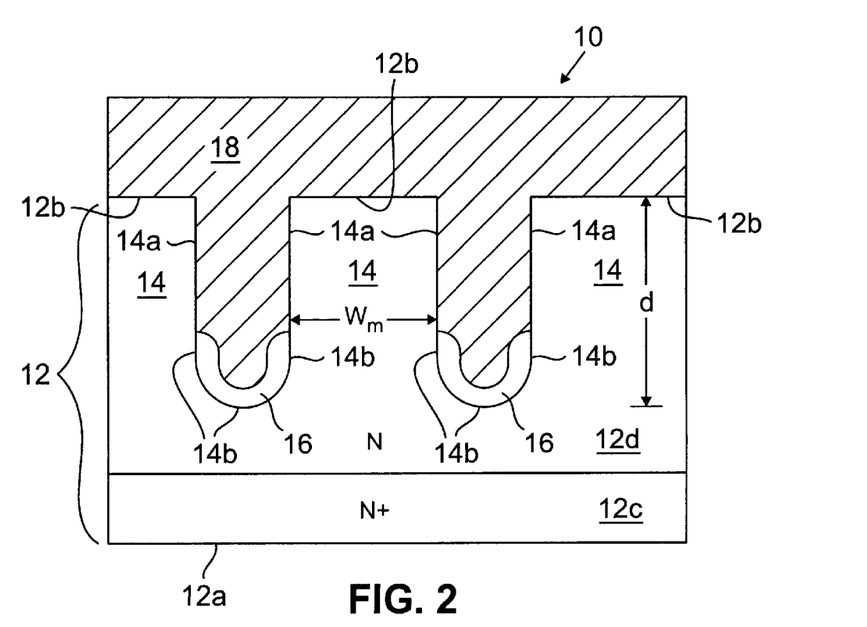
FIG. 2 is a cross-sectional representation of a trench Schottky rectifier according to an embodiment of the present invention.

Referring now to FIG. 2, a cross-sectional illustration of a Schottky barrier rectifier according to the present invention is shown. The rectifier 10 includes a semiconductor region 12 of first conductivity type, typically N-type conductivity, having a first face 12a and second opposing faces 12b. The substrate semiconductor region 12 preferably comprises a relatively highly doped cathode region 12c (shown as N+) adjacent first face 12a. As illustrated, the cathode region 12c is doped to a first conductivity type dopant concentration of about $5 \times 10^{19}/cm^3$. A drift region 12d of first conductivity type (shown as N) preferably extends from the cathode region 12c to second faces 12b. As illustrated, the drift region 12d is doped to a first conductivity type dopant concentration of about $3.3 \times 10^{16}/cm^3$ for a 30 Volt device. Drift region 12d and cathode region 12c form a non-rectifying N+/N junction.

Mesas 14 having cross-sectional width "Wm" are formed in the drift region 12d. Mesas are defined by opposing trenches. Insulating regions 16 (in this case, shown as thermally grown oxide layers) are formed within the trenches and are adjacent the semiconductor region 12 along lower portions 14b of the semiconductor/trench interfaces. Insulating regions 16 typically have a thickness on the order of about 700 to 2000 Angstroms. Wm is typically on the order of I micron. Trench depth "d" is typically on the order of 3 microns.

Mesas 14 extend in a third dimension (not shown) and can be of stripe, rectangular, cylindrical or other similar geometry. Hence, as will be understood by those skilled in the art, mesas 14 can be formed in the semiconductor region 12 using numerous trench configurations.

For example, mesa 14 can be formed between pairs of adjacent linear trenches that extend in a third dimension. As another example, an annular-shaped trench can form mesa 14. For both of these examples, when viewed in transverse cross section, the trenches will appear as shown in FIG. 2.

Anode electrode 18 is found immediately adjacent to the drain region 12d along faces 12b and along upper portions 14a of the semiconductor/trench interfaces. Anode electrode 18 is also found immediately adjacent to the insulating regions 16. Anode electrode 18 forms a Schottky barrier rectifying junction where it contacts the semiconductor drain region 12d, i.e., along upper portions 14a and second faces 12b.

Finally, a cathode electrode (not shown) is provided adjacent the cathode region 12c at the first face 12a. The cathode electrode preferably ohmically contacts the cathode region 12c.

Such a rectifier provides low forward-biased voltage drop, low reverse-biased leakage current and high breakdown voltage. Without wishing to be held to any particular theory of operation, it is believed that this design provides improved forward voltage drop by increasing the surface area of the Schottky rectifying contact between the anode electrode 18 and the drift region 12d by extending the contact area beyond second face 12b and into the upper portions 14a. At the same time, the insulating region 16 adjacent lower portions 14b, causes charge coupling to occur between the anode electrode 18 and mesa 14, favorably affecting the voltage profiles within the mesa structure and providing high reverse bias breakdown voltages and low leakage currents. It is well within the skill of those in the art to optimize the amount of trench depth d associated with upper portions 14a and the amount of trench depth d associated with lower portions 14b. Typically, a trench depth of about 3 microns is used, of which about 2 microns is in contact with the anode electrode.

Figure 3:
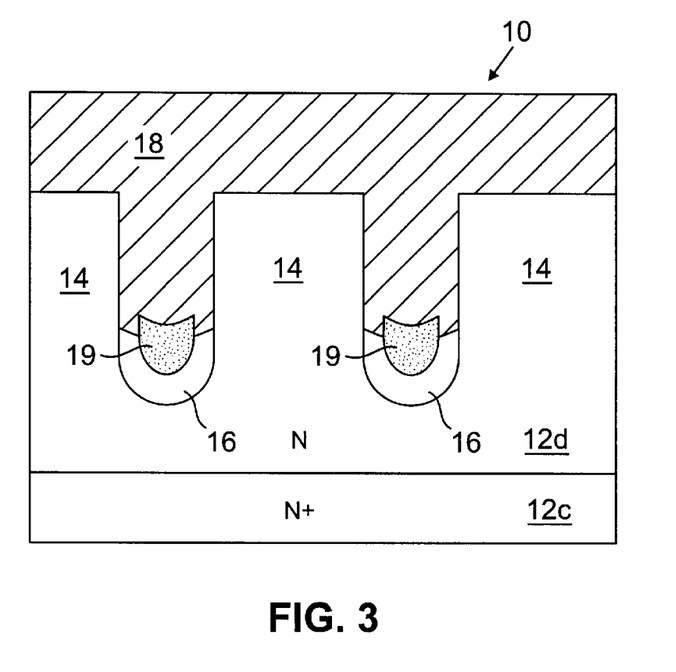
FIG. 3 is a cross-sectional representation of a trench Schottky rectifier according to an embodiment of the present invention.

Another embodiment of the present invention is provided in FIG. 3. This embodiment is similar to that of FIG. 2, except that a polysilicon conductive region 19 is provided over the insulating region 16 in the trenches between mesas 14.

Figure 4:
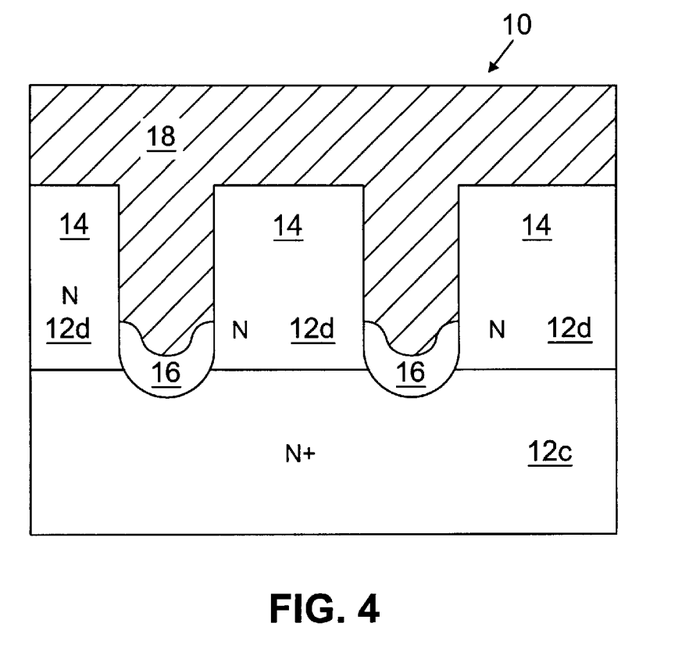
FIG. 4 is a cross-sectional representation of a trench Schottky rectifier according to an embodiment of the present invention.
Figure 5:
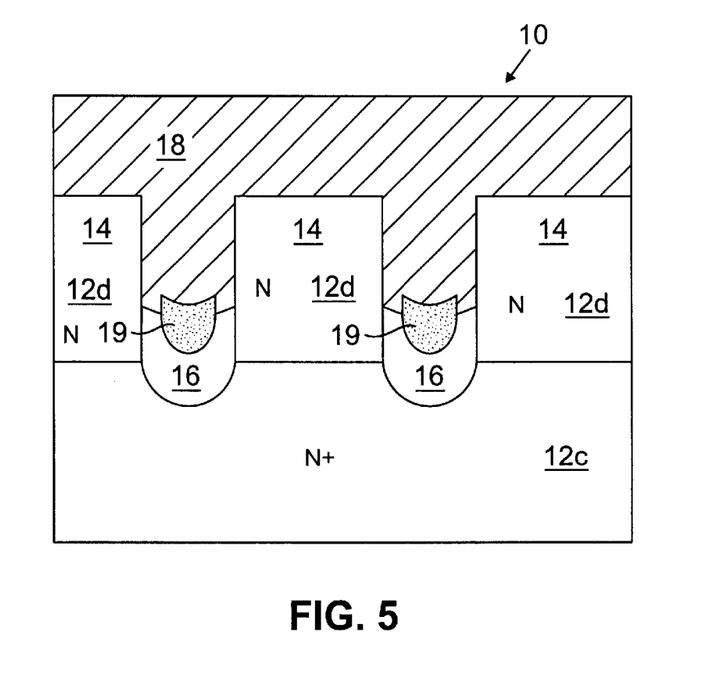
FIG. 5 is a cross-sectional representation of a trench Schottky rectifier according to an embodiment of the present invention.

Other embodiments of the present invention are shown in FIGS. 4 and 5. These embodiments are similar to those of FIGS. 2 and 3, respectively, except that the trenches extend beyond drift regions 12d and into cathode region 12c.

Figure 6:
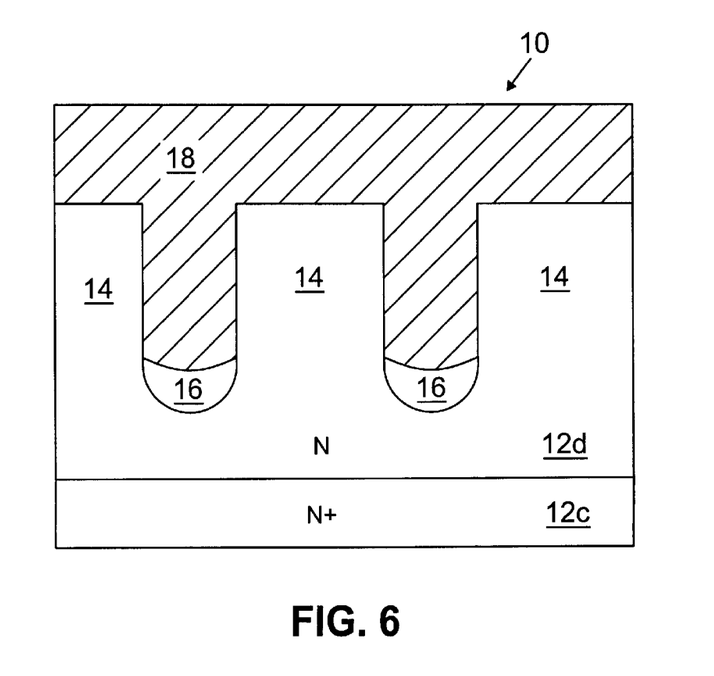
FIG. 6 is a cross-sectional representation of a trench Schottky rectifier according to an embodiment of the present invention.
Figure 7:
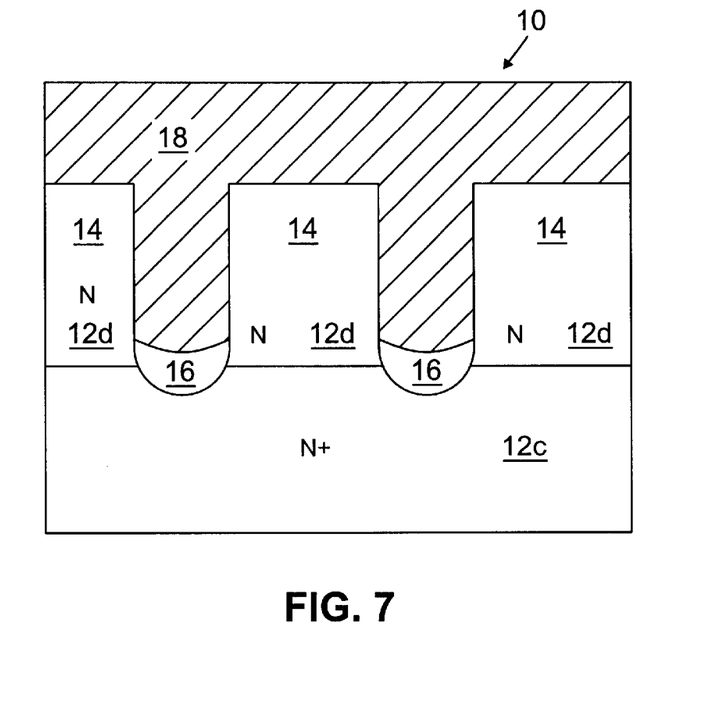
FIG. 7 is a cross-sectional representation of a trench Schottky rectifier according to an embodiment of the present invention.

Still other embodiments of the present invention are illustrated in FIGS. 6 and 7. These embodiments are similar to those of FIGS. 2 and 4, respectively, except that the insulating regions 16 in these figures comprise deposited oxide layers, rather than thermally grown layers.

Figure 8:
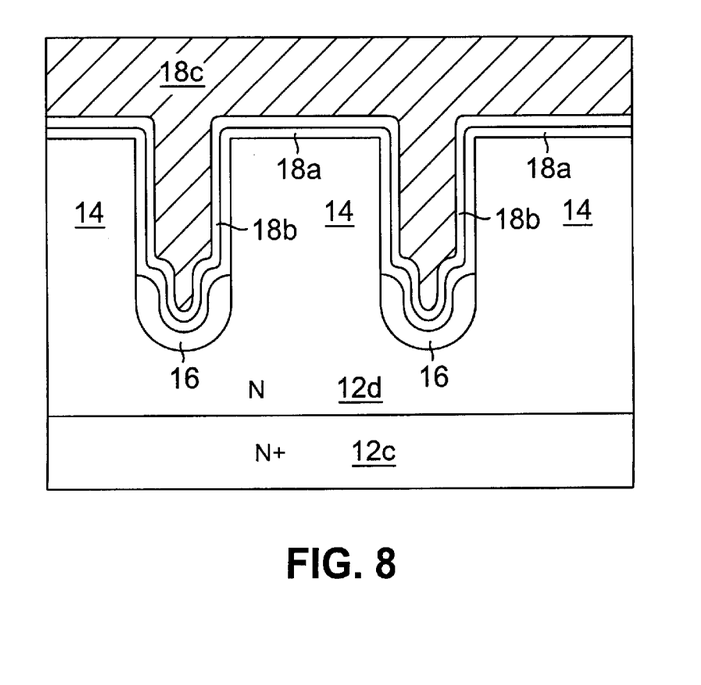
FIG. 8 is a cross-sectional representation of a trench Schottky rectifier according to an embodiment of the present invention.
Figure 9:
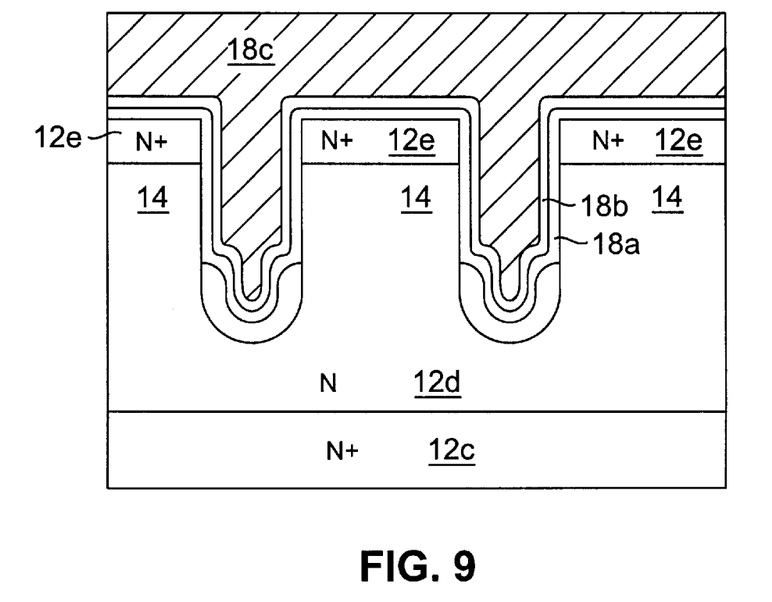
FIG. 9 is a cross-sectional representation of a trench Schottky rectifier according to an embodiment of the present invention.

Other embodiments of the present invention are shown in FIGS. 8 and 9. In FIG. 8, the Schottky rectifying characteristics of the contact between the anode electrode and the drift region 12d are improved by using a multi-layer anode electrode, which comprises a titanium layer 18a, a titanium-tungsten layer 18b and a tungsten layer 18c. In this specific example, the titanium-tungsten layer 18b comprises 50% titanium and 50% tungsten. Further improvements in forward biased voltage drop are made by forming N+ regions 12e within the device (see FIG. 9). In this specific example, the doping concentration of the N+ regions is $1 \times 10^{19}/cm^3$. FIGS. 10A–10D illustrate an embodiment of the present invention for providing the trench Schottky rectifier 10 shown in FIG. 2.

Figure 10A:
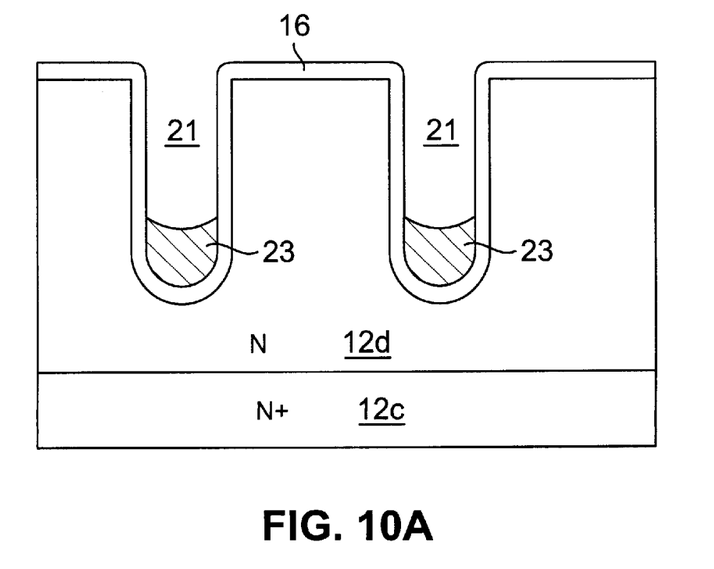
FIGS. 10A–10D are cross sectional views illustrating a method of forming the trench Schottky rectifier of FIG. 2, according to an embodiment of the invention.

Referring now to these figures, an N-doped epitaxial layer (corresponding to drift region 12d) is grown on a conventionally N+ doped substrate (corresponding to cathode region 12c). Epitaxial layer 12d is typically about 7 microns thick. Next, a photoresist masking process is used to form mask portions (not shown), which define the location of trenches 21. Trenches 21 are preferably dry etched through openings between mask portions by reactive ion etching, typically to a depth of about 3 microns. Mask portions are removed and an oxide layer 16 is formed over the surface of the entire structure by thermal oxidation. Thicknesses in the vicinity of about 700 to 2000 Angstroms are typical for thermal oxide layer 16. Subsequently, the surface is covered with photoresist, which is partially stripped, for example, by reactive ion etching, until only photoresist portions 23 at the bottoms of trenches 21 remain, covering only a portion of oxide layer 16 as shown in FIG. 10A.

Figure 10B:
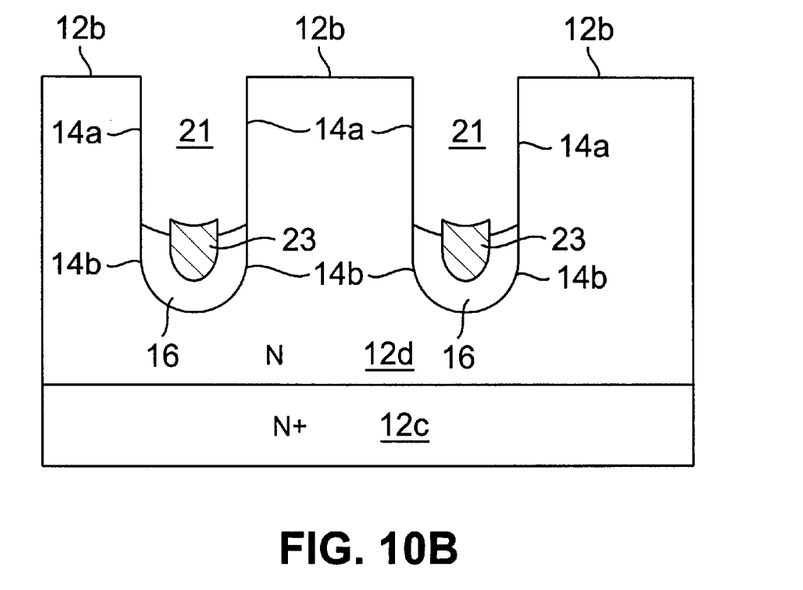

Next, oxide layer 16 is etched, for example, by wet etch, to provide oxide regions 16 as shown in FIG. 10B. In this way, surfaces 12b and upper portions 14a are exposed, while lower portions 14b remain covered with oxide.

Figure 10C:
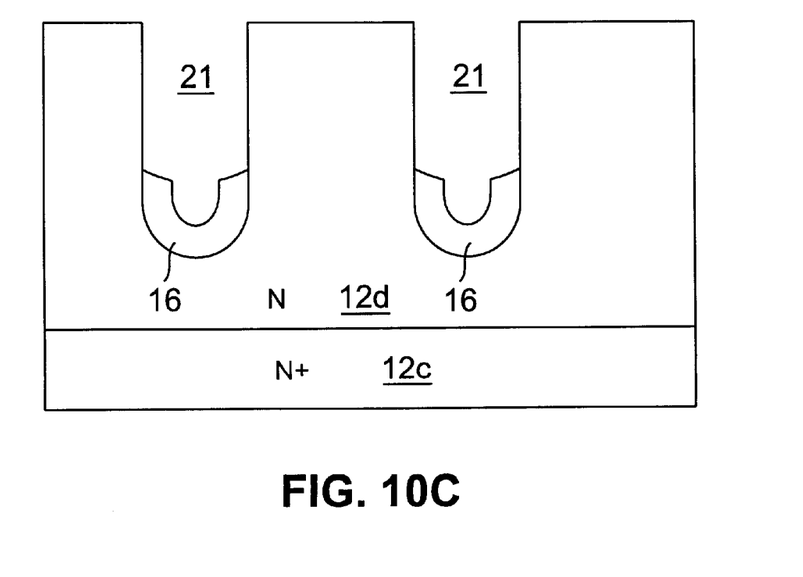

Photoresist 23 is then completely removed, for example, by reactive ion etching, to provide the structure of FIG. 10C.

Figure 10D:
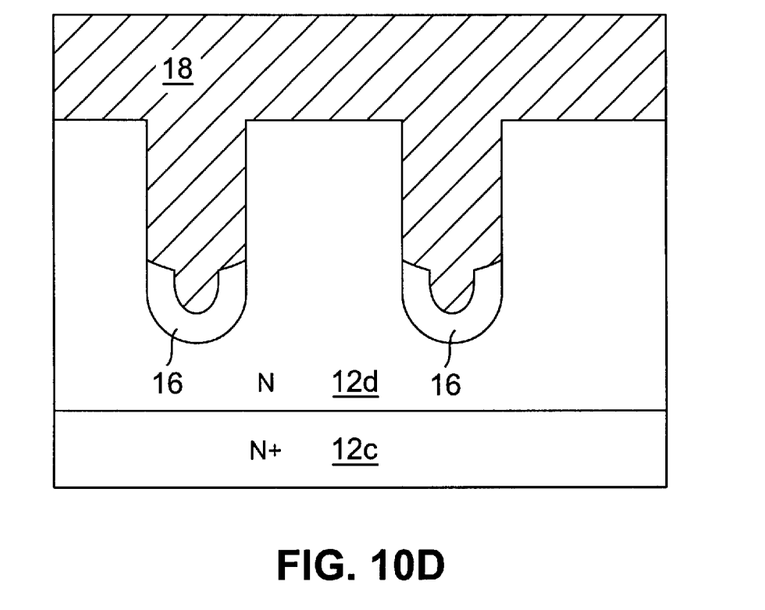

Finally, anode electrode 18 is provided to complete the structure of FIG. 10D. For example, the anode electrode can be obtained by providing (a) a Ti: W layer, followed by (b) a Pt:Si layer, followed by (c) an Al layer. As another example, the anode electrode can be obtained by providing (a) a Ti:N layer, followed by (b) a Pt:Si layer, followed by (c) an Al layer.

Yet another example of the anode electrode 18 structure is found in FIG. 8 (see discussion above). In this example, the anode electrode is obtained by providing (a) Ti layer, followed by (b) a Ti:W layer, followed by (c) a W layer.

In the event that a structure like that of FIG. 9 is to be fabricated, the above steps can be followed except that, after growing the epitaxial layer 12d, an N+ layer 12e is formed in the upper portion of epitaxial layer 12d, for example, by ion implantation and diffusion.

Figure 11A:
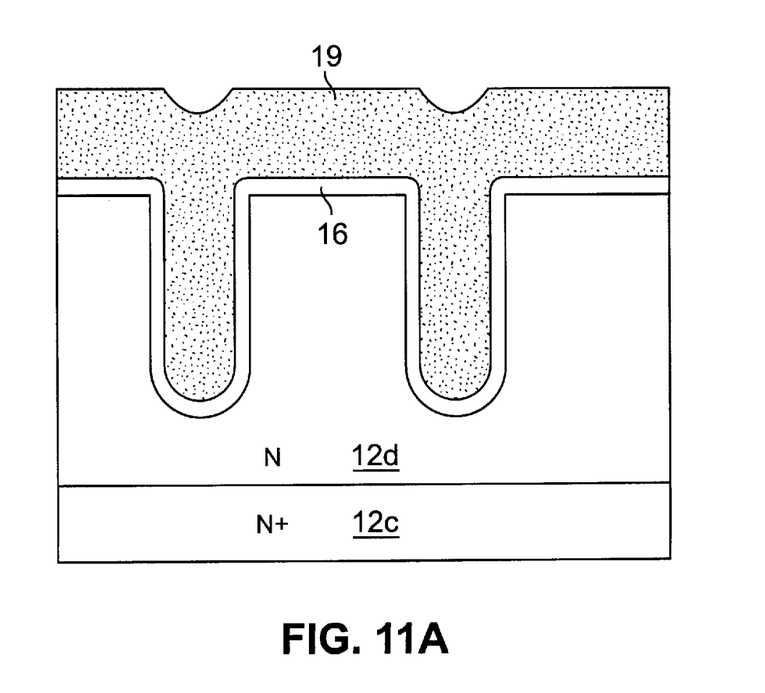
FIGS. 11A–11D are cross sectional views illustrating a method of forming the trench Schottky rectifier of FIG. 3, according to an embodiment of the invention.

FIGS. 11A–D illustrate an embodiment of the invention for forming the trench Schottky rectifier of FIG. 3. The steps for FIG. 11A are the same as for FIG. 10A up to the point after which the oxide layer 16 is thermally grown. Then, the device is covered (and the trenches are filled) with polysilicon layer 19, i.e., polycrystalline silicon, using techniques known in the art, such as CVD, to provide the structure shown in FIG. 11A. Polysilicon layer 19 is typically doped N-type to reduce its resistivity. N-type doping can be carried out, for example, during CVD with phosphorous chloride or by implantation with arsenic or phosphorous.

Figure 11B:
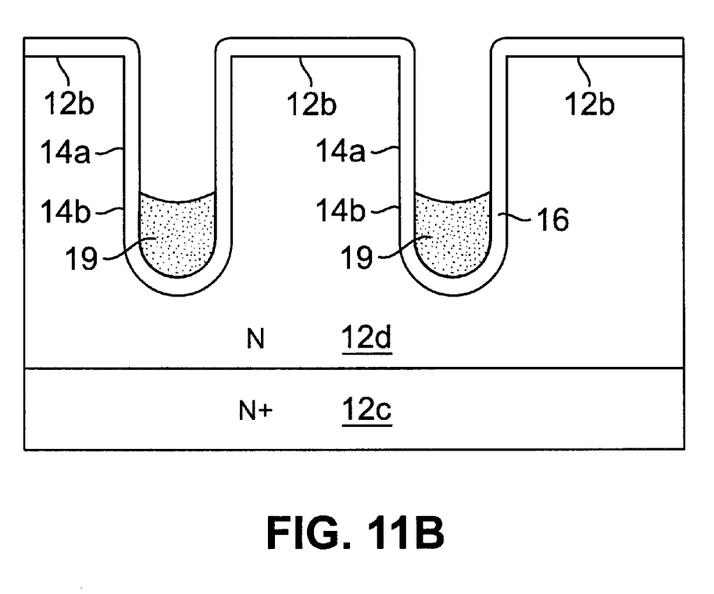

Polysilicon layer 19 is then isotropically etched, for example, by reactive ion etching, to expose the portions of oxide layer 16 over surfaces 12b and upper portions 14a as shown in FIG. 11B. Oxide layer 16 over lower portions 14b remains covered with polysilicon 19.

Figure 11C:
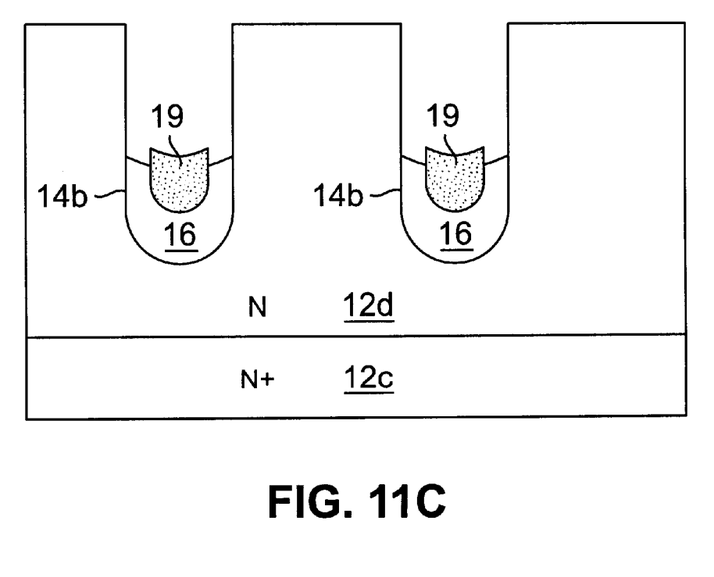
Figure 11D:
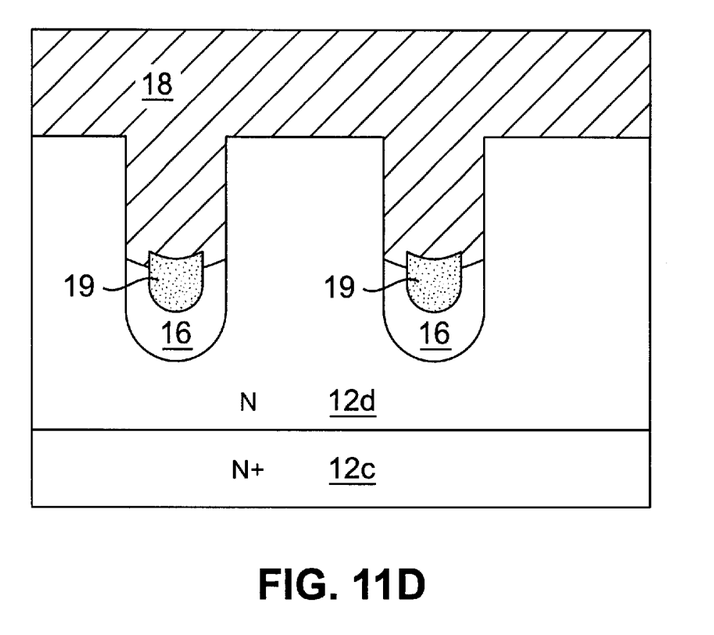

The exposed oxide layer is then preferentially etched, for example, by wet etch, leaving only portions of oxide layer 16 that are protected by polysilicon region 19, in this case, those portions of oxide layer 16 that are adjacent lower portions 14b as shown in FIG. 1C. Finally, anode electrode 18 is provided as discussed above to provide the structure of FIG. 11D.

Figure 12A:
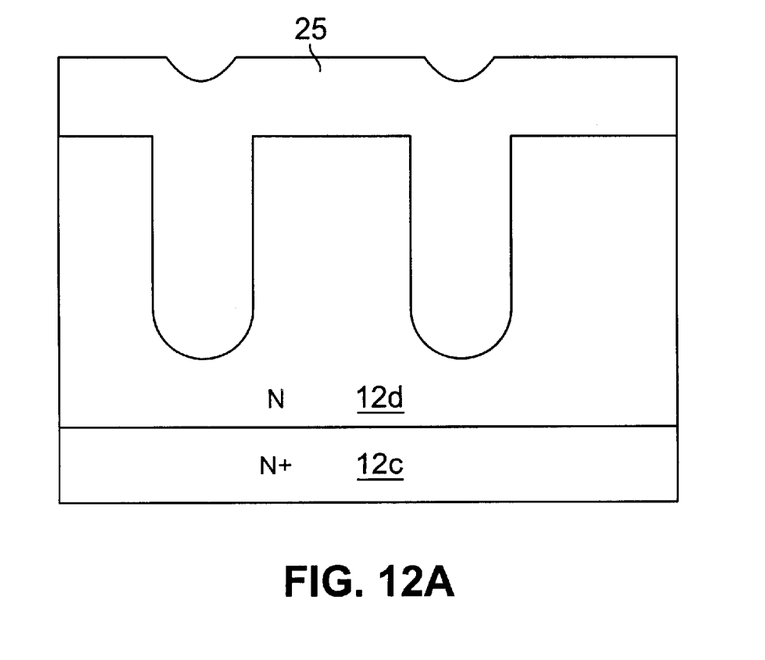
FIGS. 12A–12C are cross sectional views illustrating a method of forming the trench Schottky rectifier of FIG. 6, according to an embodiment of the invention.
Figure 12B:
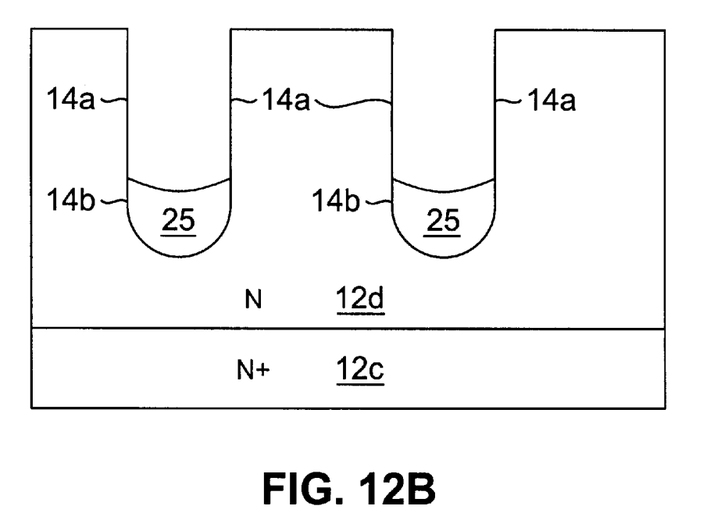
Figure 12C:
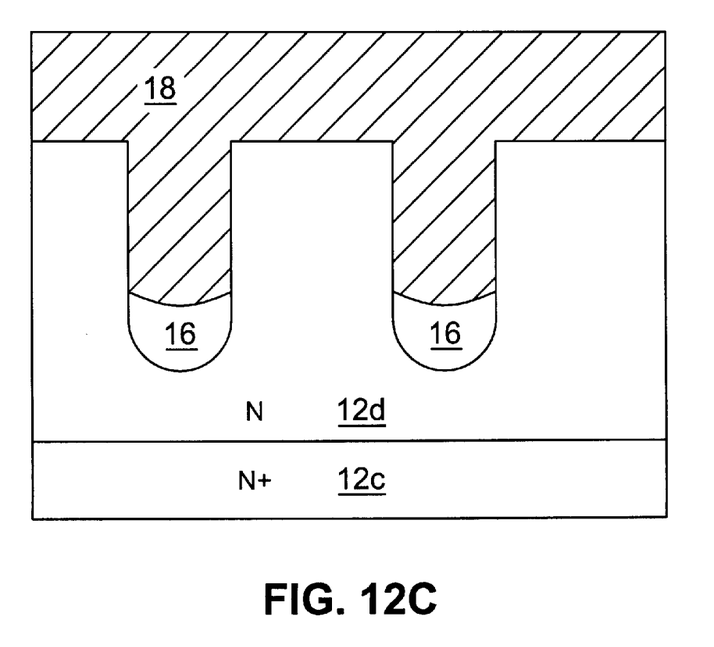

FIGS. 12A–C illustrate a further embodiment of the invention. The steps associated with FIG. 12A are the same as in FIG. 10A up to the point of trench formation. At this point, as seen in FIG. 12A, a TEOS (tetraethylorthosilicate or $Si(OC_2H_5)_4$) layer 25 is deposited, for example, by LPCVD at temperatures between 650 and 800° C., to provide the structure of FIG. 12A. After a dry isotropic etch back, for example, using a parallel-electrode (planar) type dry etcher, the structure of FIG. 12B is achieved. At this point, lower portions 14b are covered with TEOS layer 25, while upper portions 14a are not. The TEOS layer is subsequently densified to provide a high-density silicon dioxide layer 16. An anode electrode 18 is provided as discussed above, resulting in the structure of FIG. 12C.

The present invention thus provides a trench Schottky rectifier and methods of making the same. The rectifier has an anode electrode in Schottky rectifying contact with the semiconductor drain region along upper portions of the semiconductor/trench interfaces, while the drain region is separated from the rectifier anode along lower portions of the semiconductor/trench interfaces by an insulating region. The rectifier provides low forward-biased voltage drop, low reverse-biased leakage current and high breakdown voltage. Although the present invention has been described with respect to several exemplary embodiments, there are many other variations of the above-described embodiments that will be apparent to those skilled in the art. It is understood that these variations are within the teaching of the present invention, which is to be limited only by the claims appended hereto.

What is claimed is:

1. A method of forming trench Schottky rectifier, comprising:

forming a semiconductor region having first and second opposing faces, said semiconductor region comprising a cathode region of first conductivity type adjacent the first face and a drift region of said first conductivity type adjacent the second face, said drift region having a lower net doping concentration than that of said cathode region;

forming one or more trenches extending from said second face into said semiconductor region, said trenches defining one or more mesas within said semiconductor region, each of said one or more trenches having a bottom portion and side portions, wherein said bottom portion forms a trench/semiconductor interface;

forming an insulating region adjacent said semiconductor region within said one or more trenches, said insulating region contacting and covering the bottom portion of said one or more trenches, wherein at least part of each of the side portions are not covered by the insulating region; and forming an anode electrode that is (a) adjacent to and forms a Schottky rectifying contact with said semiconductor region at said second face, (b) adjacent to and forms a Schottky rectifying contact with said semiconductor region in side portions of said one or more trenches and (c) adjacent to said insulating region in said bottom portions of said one or more trenches.

2. The method of claim 1, further comprising providing a cathode electrode on said first face of said semiconductor region.

3. The method of claim 1, wherein said step of forming said semiconductor region comprises providing a semiconductor substrate, said semiconductor substrate corresponding to said cathode region; and growing an epitaxial semiconductor layer on said substrate, said epitaxial layer corresponding to said drift region.

4. The method of claim 1, wherein said step of forming said trenches comprises the steps of forming a patterned masking layer over the second face of the semiconductor region and etching said trenches through said masking layer.

5. The method of claim 1, wherein said trenches are formed such that they extend into said cathode region.

6. The method of claim 5, wherein said insulating region is formed such that it extends from said cathode region to said drift region.

7. The method of claim 1, wherein said step of forming said insulating region comprises providing an oxide layer over said second face and in said trenches; and etching portions of said oxide layer.

8. The method of claim 7, further comprising providing a photoresist pattern on the oxide layer, etching portions of the oxide layer not covered by said photoresist, and removing said photoresist.

9. The method of claim 8, wherein said oxide layer is thermally grown.

10. The method of claim 7, further comprising the steps of providing a polysilicon layer on said oxide layer, etching said polysilicon layer such that portions of said oxide layer over said second face and over said side portions of said trenches are exposed; and etching said oxide layer such that said portions of said oxide layer over said second face and over said side portions of said trenches are removed.

11. The method of claim 10, wherein said oxide layer is thermally grown.

12. The method of claim 1, wherein said step of forming said insulating region comprises depositing an oxide layer.

13. The method of claim 12, further comprising the steps of depositing a tetraethylorthosilicate layer on said second face and within said trenches; etching said tetraethylorthosilicate layer until it is removed from said second surface and said side portions of said trenches; and converting said tetraethylorthosilicate into a high density silicon dioxide layer.

14. The method of claim 1, wherein said bottom portions of said trenches correspond to approximately 25 to 40% of the depth of said trenches.

* * * * *